(12) United States Patent
Yoshida et al.

(10) Patent No.: US 11,773,323 B2
(45) Date of Patent: Oct. 3, 2023

(54) FLUORESCENT MATERIAL AND METHOD FOR PRODUCING SAME

(71) Applicant: NICHIA CORPORATION, Anan (JP)

(72) Inventors: Shigeki Yoshida, Anan (JP); Takayuki Shinohara, Anan (JP); Hiroyuki Watanabe, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/154,147

(22) Filed: Jan. 13, 2023

(65) Prior Publication Data

US 2023/0235223 A1    Jul. 27, 2023

(30) Foreign Application Priority Data

Jan. 27, 2022 (JP) .................. 2022-011018

(51) Int. Cl.
*C09K 11/77* (2006.01)
*G03B 21/20* (2006.01)

(52) U.S. Cl.
CPC ...... *C09K 11/77747* (2021.01); *G03B 21/204* (2013.01)

(58) Field of Classification Search
CPC ............. C09K 11/77747; G03B 21/204
USPC ........................................... 362/84
See application file for complete search history.

(56) References Cited

U.S. PATENT DOCUMENTS

| | | | |
|---|---|---|---|
| 9,899,405 B2* | 2/2018 | Kim | H01L 21/2255 |
| 2013/0241397 A1* | 9/2013 | Hong | C09K 11/0883 |
| | | | 313/503 |
| 2014/0362557 A1* | 12/2014 | Ulasyuk | F21K 9/64 |
| | | | 362/84 |
| 2015/0137037 A1* | 5/2015 | Takeda | C09K 11/77348 |
| | | | 427/372.2 |
| 2020/0148947 A1 | 5/2020 | Koizumi et al. | |
| 2021/0193883 A1* | 6/2021 | Baretz | H01L 33/64 |

FOREIGN PATENT DOCUMENTS

| | | |
|---|---|---|
| JP | 2006269938 A | 10/2006 |
| JP | 2012180404 A | 9/2012 |
| JP | 2013249375 A | 12/2013 |
| JP | 2019112589 A | 7/2019 |
| WO | 2013183620 A1 | 12/2013 |
| WO | 2019017394 A1 | 1/2019 |

* cited by examiner

*Primary Examiner* — Christopher M Raabe
(74) *Attorney, Agent, or Firm* — HUNTON ANDREWS KURTH LLP

(57) ABSTRACT

Provided is a fluorescent material with high brightness. The fluorescent material includes a nitride fluorescent material comprising La, Ce, Si, and N; and a first phosphorus compound disposed on a surface of the nitride fluorescent material. The first phosphorus compound includes at least one selected from the group consisting of lanthanum phosphate, lanthanum hydrogen phosphate, and hydrates thereof. A content of phosphorus atoms in the fluorescent material is 0.07% by mass or higher and 0.8% by mass or lower.

9 Claims, 4 Drawing Sheets

50

50

FLUORESCENT MATERIAL AND METHOD FOR PRODUCING SAME

CROSS-REFERENCE TO RELATED APPLICATIONS

This application claims priority to Japanese Patent Application No. 2022-011018, filed on Jan. 27, 2022, the disclosure of which is hereby incorporated by reference in their entirety.

BACKGROUND

Field of the Invention

The present disclosure relates to a fluorescent material and a method for producing the fluorescent material.

Description of the Related Art

A light emitting device that includes a combination of a blue light emitting diode (LED) chip or a blue light emitting laser diode (LD), and a yellow fluorescent material is present as a light emitting device. Such a nitride-based fluorescent material is known as a yellow fluorescent material as, for example, the one that is described in Japanese Laid-Open Patent Publication No. 2019-112589 and that has a composition represented by $La_3Si_6N_{11}$:Ce. Japanese Laid-Open Patent Publication No. 2019-112589 proposes a producing method according to which heat treatment is applied to a nitride-based fluorescent material in the presence of a fluorine containing substance.

SUMMARY

A first exemplary embodiment is a fluorescent material including a nitride fluorescent material comprising lanthanum (La), cerium (Ce), silicon (Si), and nitrogen (N), and a first phosphorus compound disposed on a surface of the nitride fluorescent material. The first phosphorus compound includes at least one selected from the group consisting of lanthanum phosphate, lanthanum hydrogen phosphate, and hydrates thereof. The content of phosphorus atoms in the fluorescent material is 0.07% by mass or higher and 0.8% by mass or lower.

A second exemplary embodiment is a method for producing a fluorescent material, the method including applying heat treatment to a nitride fluorescent material having a composition represented by Formula (1) below at a temperature of 90° C. or higher and 400° C. or lower in the presence of a second phosphorus compound at 0.1% by mass or higher and 47% by mass or lower relative to the nitride fluorescent material, and liquid or gaseous water.

$$La_pCe_sM^1{}_qM^2{}_rN_t \qquad (1)$$

In Formula (1), $M^1$ represents at least one selected from the group consisting of the rare earth elements except La and Ce, and includes at least one of Y, Gd, or Lu, $M^2$ represents at least one selected from the group consisting of Si, Ge, B, Al, and Ga, and includes at least Si, and p, q, r, s, and t satisfy $2.7 \leq p+q+s \leq 3.3$, $0 \leq q \leq 1.2$, $5.4 \leq r \leq 6.6$, $10 \leq t \leq 12$, and $0 < s \leq 1.2$.

A third exemplary embodiment is a light emitting device including a light emitting element that has a light emission peak wavelength in a wavelength range at 350 nm or more and 500 nm or less, and a wavelength converting member containing the fluorescent material according to the first exemplary embodiment that is excited by the light emitting element.

DETAILED DESCRIPTION

Figure 1A:
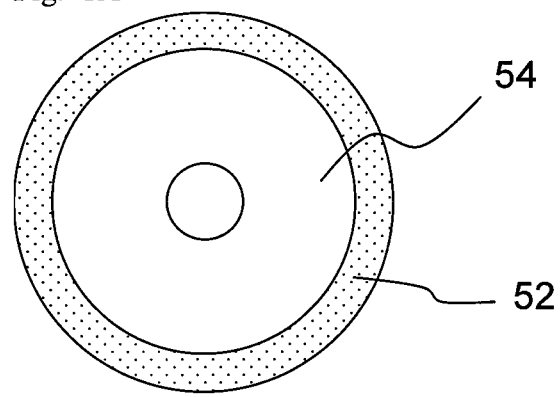
FIG. 1A is an exemplary plan diagram of an exemplary wavelength converting member seen from the side of the principal surface thereof.

The term "step" as used herein encompasses not only an independent step but also a step not clearly distinguishable from another step as long as the intended purpose of the step is achieved. If multiple substances correspond to a component in a composition, the content of the component in the composition means the total amount of the multiple substances present in the composition unless otherwise specified. Further, upper limit and lower limit values that are described for a numerical range in the present specification can be arbitrarily selected and combined. In this description, a relationship between a color name and a chromaticity coordinate, a relationship between a wavelength range of light and a color name of monochromatic light, etc. comply with JIS Z8110. A half-value width of a phosphor and a light emitting element means a wavelength width (full width at half maximum; FWHM) of the emission spectrum in which the emission intensity is 50% of the maximum emission intensity in the emission spectrum of the phosphor and the light emitting element. Embodiments of the present invention will now be described in detail. However, the embodiments described below exemplify a fluorescent material and a method for producing the same for embodying the technical idea of the present invention, and the present invention is not limited to the fluorescent material and the method for producing the same described below.

Fluorescent Material

A fluorescent material includes a nitride fluorescent material that includes lanthanum (La), cerium (Ce), silicon (Si), and nitrogen (N), and a first phosphorus compound present on the surface of the nitride fluorescent material. The first phosphorus compound includes at least one selected from the group consisting of lanthanum phosphate, lanthanum hydrogen phosphate, and hydrates thereof. The content of phosphorus atoms included in the fluorescent material is 0.07% by mass or higher and 0.8% by mass or lower.

A fluorescent material including a nitride fluorescent material that has, on the surface thereof, a specific phosphorus compound in a predetermined amount may achieve high brightness. It is presumed that this is because the difference in the refractive index between the phosphorus compound and an air becomes smaller than the difference in the refractive index between the nitride fluorescent material and the air by disposing the phosphorus compound having a low refractive index on the surface of the nitride fluorescent material having a high refractive index, and the extraction efficiency of the light may therefore be improved.

The nitride fluorescent material may further include, in the composition thereof, a rare earth element $M^1$ that is at least one selected from the group consisting of the rare earth elements except La and Ce. The rare earth element $M^1$ that is included in the composition of the nitride fluorescent material and that is other than La and Ce may include at least one selected from the group consisting of at least Y, Gd, and Lu, may include at least one of Y and Gd, and may include at least Y.

As to the composition of the nitride fluorescent material, in the case where the number of moles of Si is, for example, 6, the ratio of the number of moles of La may be, for example, 0.5 or greater and 3.05 or smaller. The ratio of the number of moles of La may be preferably 1.2 or greater or 2.0 or greater, and may be preferably 2.9 or smaller and 2.2 or smaller. As to the composition of the nitride fluorescent material, in the case where the number of moles of Si is 6, the ratio of the number of moles of Ce may be 1.2 or smaller. The ratio of the number of moles of Ce may be preferably 0.15 or greater or 0.30 or greater, and may be preferably 1.0 or smaller and 0.8 or smaller. As to the composition of the nitride fluorescent material, in the case where the number of moles of Si is, for example, 6, the ratio of the number of moles of $M^1$ may be, for example, 0 or greater and 1.2 or smaller. The ratio of the number of moles of $M^1$ may be preferably 0.3 or greater, or 0.5 or greater, and may be preferably 1.0 or smaller, or 0.8 or smaller. As to the composition of the nitride fluorescent material, in the case where the number of moles of Si is 6, the ratio of the number of moles of nitrogen may be, for example, 10 or greater and 12 or smaller, may be preferably 10.5 or greater, or 10.8 or greater, and may be preferably 11.5 or smaller, or 11.3 or smaller.

As to the composition of the nitride fluorescent material, in the case where the number of moles of Si is, for example, 6, the ratio of the total number of moles of La, Ce and $M^1$ may be, for example, 2.7 or greater and 3.3 or smaller. The ratio of the total number of moles of La, Ce and $M^1$ may be preferably 2.8 or greater, or 2.9 or greater and may be preferably 3.2 or smaller, or 3.1 or smaller.

In the composition of the nitride fluorescent material, a portion of Si may be substituted by a group 13 element(s) or a group 14 element(s) that includes at least one selected from the group consisting of Ge, B, Al, and Ge.

The nitride fluorescent material may have a composition that is represented by Formula (1) below.

$$La_pCe_sM^1_qM^2_rN_t \quad (1)$$

In Formula (1), $M^1$ represents at least one selected from the group consisting of the rare earth elements except La and Ce, and includes at least one of Y, Gd, or Lu. $M^2$ represents at least one selected from the group consisting of Si, Ge, B, Al, and Ga, and includes at least Si. p, q, r, s, and t satisfy $2.7 \le p+q+s \le 3.3$, $0 \le q \le 1.2$, $5.4 \le r \le 6.6$, $10 \le t \le 12$, and $0 < s \le 1.2$.

In Formula (1), $M^1$ may include at least one of Y and Gd, and may include at least Y. In this case, in Formula (1), p, q, r, s, and t may preferably satisfy $2.8 \le p+q+s \le 3.2$, $0.3 \le q \le 1.0$, $5.5 \le r \le 6.5$, $10.5 \le t \le 11.5$, and $0.15 \le s \le 1.0$, or $2.9 \le p+q+s \le 3.1$, $0.5 \le q \le 0.8$, $5.8 \le r \le 6.2$, $10.8 \le t \le 11.3$, and $0.3 \le s \le 0.8$.

As to the composition of the nitride fluorescent material, the metal elements therein may be determined using, for example, inductively coupled plasma (ICP) atomic emission spectroscopy. The nitrogen atoms (N) therein can be determined using, for example, an oxygen, nitrogen, and hydrogen elemental analyzer.

The fluorescent material has therein a first phosphorus compound disposed on the surface of the nitride fluorescent material. The first phosphorus compound may be physically disposed on the surface of the nitride fluorescent material by the Van der Waals force or the like, or may be disposed by chemically bonding to the surface of the nitride fluorescent material by covalent bonding, ionic bonding, or the like. The first phosphorus compound includes at least one selected from the group consisting of lanthanum phosphate, lanthanum hydrogen phosphate, and hydrates thereof. The first phosphorus compound may include one of the above alone or may include two or more thereof in combination. It is preferred that, as to the surface of the nitride fluorescent material, the overall surface be completely covered by a film or particles that include(s) the first phosphorus compound. A portion of the film of the first phosphorus compound may however partially be absent, and a portion of the surface of the nitride fluorescent material may be exposed to the extent that the effect is achieved. The covering rate by the first phosphorus compound in the fluorescent material may be, for example, 50% or higher, and may be preferably 80% or higher, or 90% or higher. The covering rate of the fluorescent material by the first phosphorus compound is calculated as a ratio of the area covered by the first phosphorus compound to the surface area of the particles of the nitride fluorescent material.

Examples of lanthanum phosphate and hydrates thereof include $LaPO_4 \cdot nH_2O$, $LaP_3O_9 \cdot nH_2O$, $LaP_5O_{14} \cdot nH_2O$, $La_2P_6O_{18}$, $La_2P_6O_{18} \cdot nH_2O$, $La_3PO_7 \cdot nH_2O$, $La_5P_6O_{22.5} \cdot nH_2O$, $La_5P_{10}O_{36.5} \cdot nH_2O$, $La_7P_3O_{18} \cdot nH_2O$, and the like, and combinations thereof. Examples of lanthanum hydrogen phosphate and hydrates thereof include $LaHP_2O_7 \cdot nH_2O$, $LaH_2PO_4 \cdot nH_2O$, $LaH_3P_2O_6 \cdot nH_2O$, $La(H_2PO_2)_3 \cdot nH_2O$, $La(H_2PO_3)_3 \cdot nH_2O$, $La_2(HPO_3)_3 \cdot nH_2O$, $La_4H_3(PO_4)_5 \cdot nH_2O$, and the like, and combinations thereof.

The content of the first phosphorus compound in the fluorescent material may be, as the content of phosphorus atoms, for example, 0.07% by mass or higher and 0.8% by mass or lower. The content of the phosphorus atoms in the fluorescent material may be preferably 0.08% by mass or higher, 0.1% by mass or higher, and 0.2% by mass or higher, or 0.3% by mass or higher, and may be preferably 0.7% by mass or lower, or 0.5% by mass or lower. When the content of the phosphorus atoms in the fluorescent material is in the above ranges, the light emission intensity tends to be further improved. The content of the phosphorus atoms in the fluorescent material may be determined using, for example, inductively coupled plasma (ICP) atomic emission spectroscopy.

The fluorescent material may further include oxygen atoms and hydrogen atoms. The oxygen atoms and the hydrogen atoms may be included as the first phosphorus compound, may be included as hydroxy groups or the like on the surface of the nitride fluorescent material, or may be included as a portion of the composition of the nitride fluorescent material. The content of the oxygen atoms included in the fluorescent material may be, for example, 0.6% by mass or higher. The content of the oxygen atoms in the fluorescent material may be preferably 0.7% by mass or higher, 0.8% by mass or higher, 1.0% by mass or higher, or 1.2% by mass or higher, and may be preferably 4% by mass or lower, 3.5% by mass or lower, or 2% by mass or lower. The content of the oxygen atoms in the fluorescent material can be determined using, for example, an oxygen, nitrogen, and hydrogen elemental analyzer.

The content of the hydrogen atoms included in the fluorescent material may be, for example, 0.02% by mass or higher. The content of the hydrogen atoms in the fluorescent material may be preferably 0.03% by mass or higher, or 0.05% by mass or higher, and may be preferably 0.10% by mass or lower, or 0.08% by mass or lower. The content of the hydrogen atoms in the fluorescent material can be determined using, for example, an oxygen, nitrogen, and hydrogen elemental analyzer.

Because the fluorescent material includes the nitride fluorescent material and the first phosphorus compound, as to the composition of the fluorescent material, in the case where the number of moles of Si is, for example, 6, the ratio of the number of moles of P may be, for example, 0.15 or smaller. The ratio of the number of moles of P may be preferably 0.01 or greater, 0.02 or greater, or 0.05 or greater and may be preferably 0.12 or smaller, or 0.1 or smaller. Because the fluorescent material may further include oxygen atoms, as to the composition of the fluorescent material, in the case where the number of moles of Si is, for example 6, the ratio of the number of moles of O may be, for example, 1.5 or smaller. The ratio of the number of moles of O may be preferably 0.25 or greater, 0.3 or greater, or 0.5 or greater and may be preferably 1.4 or smaller, or 1.2 or smaller. Because the fluorescent material may further include hydrogen atoms, as to the composition of the fluorescent material, in the case where the number of moles of Si is, for example, 6, the ratio of the number of moles o H may be, for example, 0.75 or smaller. The ratio of the number of moles of H may be preferably 0.15 or greater, 0.2 or greater, or 0.3 or greater, and may be preferably 0.6 or smaller, or 0.5 or smaller.

The fluorescent material including the nitride fluorescent material and the first phosphorus compound present on the surface of the nitride fluorescent material may have a composition represented by, for example, Formula (2) below as the overall fluorescent material including the compositions of the nitride fluorescent material and the first phosphorus compound mainly present on the surface thereof.

$$La_pCe_sM^1_qM^2_rN_tP_xO_yH_z \quad (2)$$

In Formula (2), $M^1$ represents at least one selected from the group consisting of the rare earth elements except La and Ce, and may include at least one selected from the group consisting of at least Y, Gd, and Lu. $M^2$ represents at least one selected from the group consisting of Si, Ge, B, Al, and Ga, and may include at least Si. p, q, r, s, t, x, y, and z therein may satisfy 2.7≤p+q+s≤3.3, 0≤q≤1.2, 5.4≤r≤6.6, 9.5≤t≤11.5, 0<s≤1.2, 0<x≤0.15, 0<y≤1.5, and 0<z≤0.75.

In Formula (2), $M^1$ may include at least one of Y and Gd, and may include at least Y. In Formula (2), p, q, r, s, t, x, y, and z may satisfy preferably 2.8≤p+q+s≤3.2, 0.3≤q≤1.0, 5.5≤r≤6.5, 10.5≤t≤11.5, 0.15≤s≤1.0, 0.01≤x≤0.15, 0.25≤y≤1.5, and 0.15≤z≤0.75, or may satisfy 2.9≤p+q+s≤3.1, 0.5≤q≤0.8, 5.8≤r≤6.2, 10.8≤t≤11.3, 0.3≤s≤0.8, 0.02≤x≤0.12, 0.3≤y≤1.4, and 0.2≤z≤0.6.

From the viewpoint of the light emission intensity, the particle size distribution of the fluorescent material may present a particle size distribution with a single peak. The median particle diameter (Dm) of the fluorescent material may be, for example, 5 μm or larger and 40 μm or smaller. The median particle diameter of the fluorescent material may be preferably 10 μm or larger, or 15 μm or larger, and may be preferably 35 μm or smaller, or 30 μm or smaller. As for the volume-based particle size distribution, the median particle diameter of the fluorescent material is calculated as the particle diameter that corresponds to 50% of the accumulated volume from the side of the small diameter. The volume-based particle size distribution can be measured using, for example, a laser diffraction particle size distribution measuring apparatus.

The fluorescent material may absorb light having a wavelength of, for example, 350 nm or more and 500 nm or less, and may have a light emission peak wavelength in a wavelength range of, for example, 520 nm or more and 620 nm or less. The lower limit of the light emission peak wavelength of the nitride fluorescent material may be preferably 525 nm or more, or 530 nm or more. The upper limit of the light emission peak wavelength of the nitride fluorescent material may be preferably 615 nm or less, or 610 nm or less. The half maximum full width in the light emission spectrum of the nitride fluorescent material may be, for example, 100 nm or more and may be preferably 105 nm or more, or 110 nm or more. The upper limit of the half maximum full width may be, for example, 150 nm or less and may be preferably 140 nm or less, or 130 nm or less.

Method for Producing Fluorescent Material

A method for producing the fluorescent material includes a heat treatment step in which heat treatment is applied to the nitride fluorescent material that includes lanthanum (La), cerium (Ce), silicon (Si), and nitrogen atoms (N) at a temperature of 90° C. or higher and 400° C. or lower in the presence of a second phosphorus compound at 0.1% by mass or higher and 47% by mass or lower relative to the nitride fluorescent material, and liquid or gaseous water.

A fluorescent material having improved light emission intensity may be obtained by applying the heat treatment to the nitride fluorescent material having a specific composition at a predetermined temperature in the present of the second phosphorus compound in a predetermined amount, and water. It may be considered for the above, for example, as follows. For example, hydroxy groups are formed by the fact that the water or water vapor acts on the surface of the nitride fluorescent material by applying the heat treatment to the nitride fluorescent material in the presence of water. The nitride fluorescent material having the hydroxy groups formed thereon and the second phosphorus compound are caused to react with other by the heat treatment and the first phosphorus compound is thereby formed on the surface of the nitride fluorescent material. It may be considered that the light emission intensity of the fluorescent material is improved by the fact that the formed first phosphorus compound adheres to the surface of the nitride fluorescent material. "Water" as used herein means water in a broad sense as a substance (for example, hydrogen hydroxide), and the state thereof may be a liquid (the what-is-called water) or a gas (for example, water vapor).

The nitride fluorescent material to be used in the heat treatment may be purchased to be prepared or may be prepared by producing a nitride fluorescent material having desired properties. A method for producing the nitride fluorescent material will be described later. The details of the nitride fluorescent material to be used in the heat treatment is as above, and preferred aspects are also as above. In one embodiment, the nitride fluorescent material may have the composition represented by Formula (1) above.

In the heat treatment step, heat treatment is applied to the nitride fluorescent material at a temperature of 90° C. or higher and 400° C. or lower in the presence of the second phosphorus compound in an amount at 0.1% by mass or higher and 47% by mass or lower relative to the nitride fluorescent material, and liquid or gaseous water, to obtain a heat treated substance. The obtained heat treated substance may include a desired fluorescent material. In the heat treatment step, the first phosphorus compound including at least one selected from the group consisting of lanthanum phosphate, lanthanum hydrogen phosphate, and hydrates thereof may be formed on the surface of the nitride fluorescent material, from the second phosphorus compound and the liquid or gaseous water. The formed first phosphorus compound may be formed by the reaction of the water and the second phosphorus compound, with the nitride fluorescent material.

The second phosphorus compound to be used in the heat treatment step may be, for example, a water-soluble phosphate. Examples of the second phosphorus compound include, for example, water-soluble phosphates such as phosphoric acid, phosphorus oxide, a phosphate ammonium salt, an alkali metal phosphate, and an alkali earth metal phosphate, and combinations thereof. The second phosphorus compound may include at least one selected from the group consisting of phosphoric acid, a phosphorus oxide, a phosphate ammonium salt, an alkali metal phosphate, and an alkali earth metal phosphate, may include at least one selected from the group consisting of at least phosphoric acid and a phosphate ammonium salt, and may include at least a phosphate ammonium salt. "Water-soluble" means that the solubility thereof for 100 g of water at 25° C. is, for example, 10 g or higher.

Examples of the phosphoric acid in the second phosphorus compound include, for example, pyro-phosphoric acid, meta-phosphoric acid, and ortho-phosphoric acid, and combinations thereof. Examples of the phosphorus oxide include, for example, phosphorus pentoxide and the like, and combinations thereof. Examples of the phosphate ammonium salt include triammonium phosphate, diammonium hydrogen phosphate, ammonium dihydrogen phosphate, and the like, and combinations thereof. Examples of the alkali metal phosphate include trisodium phosphate, tripotassium phosphate, disodium hydrogen phosphate, dipotassium hydrogen phosphate, sodium di hydrogen phosphate, potassium dihydrogen phosphate, and the like, and combinations thereof. Examples of the alkali earth metal phosphate include calcium hydrogen phosphate and the like, and combinations thereof.

In the heat treatment step, the second phosphorus compound in an amount at 0.1% by mass or higher and 47% by mass or lower relative to the nitride fluorescent material may be used. The use amount of the second phosphorus compound may be preferably 1% by mass or higher, or 5% by mass or higher, and may be preferably 40% by mass or lower, or 30% by mass or lower.

The presence amount of water used in the heat treatment step may be, for example, 85% or higher, and preferably 90% or higher or 95% or higher as the relative humidity of the atmosphere in the heat treatment step. The upper limit of the relative humidity of the atmosphere in the heat treatment step may be, for example, 100% or lower. For example, an unsaturated accelerated pressure cooker testing apparatus (PCT) capable of increasing the barometric pressure in a tank using a vapor to set an environment of a high humidity and a high pressure is usable as a method of executing the heat treatment step in the above atmosphere.

The heat treatment temperature in the heat treatment step may be, for example, 90° C. or higher and 400° C. or lower to set the relative humidity of the atmosphere in the heat treatment step to be as above. The heat treatment temperature may be preferably 100° C. or higher, or 150° C. or higher, and may be preferably 350° C. or lower, or 300° C. or lower. The heat treatment can be executed by, for example, increasing the temperature from the room temperature to a predetermined heat treatment temperature and maintaining the predetermined temperature. The heat treatment time period may be, for example, 1 hour or more and 100 hours or less as the time period to maintain the predetermined heat treatment temperature. The heat treatment time period may be preferably 5 hours or more, or 10 hours or more, and maybe preferably 50 hours or less, or 30 hours or less.

The pressure in the heat treatment step may be, for example, −0.010 MPa or higher and 15 MPa or lower as the gauge pressure. The pressure in the heat treatment step may be preferably 0.15 MPa or higher, or 0.30 MPa or higher, and may be preferably 1.0 MPa or lower, or 0.80 MPa or lower.

The heat treated substance formed in the heat treatment step includes the first phosphorus compound. The content of the first phosphorus compound in the heat treated substance may be, for example, 0.07% by mass or higher and 0.8% by mass or lower, may be preferably 0.1% by mass or higher, or 0.3% by mass or higher, and may be preferably 0.7% by mass or lower, or 0.5% by mass or lower as the content of phosphorus atoms.

The heat treatment step may be executed by, for example, applying the heat treatment to a mixture including the nitride fluorescent material and the second phosphorus compound in the present of liquid or gaseous water. The heat treatment step may include, for example, a first step in which hydroxy groups are formed on the surface of the nitride fluorescent material by the reaction of the nitride fluorescent material with the liquid or gaseous water, and a second step in which the first phosphorus compound is formed from the hydroxy groups formed on the surface of the nitride fluorescent material and the second phosphorus compound.

In the first step, the nitride fluorescent material and the liquid or gaseous water are reacted with each other to form the hydroxy groups, for example, on the surface of the nitride fluorescent material. The first step may include, for example, a partial hydrolysis reaction on the surface of the nitride fluorescent material. The first step can be executed by, for example, applying the heat treatment to the nitride fluorescent material in the presence of water. The presence amount of the water in the first step only has to be a three-fold equivalence or more based on the mass relative to the amount of the fluorescent material, may be preferably a four-fold equivalence or more, or a five-fold equivalence or more, and may be preferably a 10-fold equivalence or less, or eight-fold equivalence or less. The heat treatment temperature in the first step may be, for example, 90° C. or higher and 400° C. or lower and may be preferably 95° C. or higher and 150° C. or lower.

In the second step, the first phosphorus compound is formed on the surface of the nitride fluorescent material by applying heat treatment to the nitride fluorescent material obtained in the first step and the second phosphorus compound. The second step may be executed by applying the heat treatment to the mixture of the nitride fluorescent material obtained in the first step and the second phosphorus compound. The heat treatment temperature in the second step may be, for example, 90° C. or higher and 400° C. or lower. The heat treatment temperature in the second step may be preferably 100° C. or higher, or 120° C. or higher, and may be preferably 350° C. or lower, or 300° C. or lower.

The heat treatment time period in the second step may be, for example, 1 hour or more and 100 hours or less, and may be preferably 5 hours or more and 50 hours or less. The second step may be executed in the presence of water. The water in the second step may be liquid water or may be gaseous water. In the case where the water in the second step is a gas, the relative humidity of the atmosphere in the second step only has to be, for example, 5% or higher and may be preferably 90% or higher, or 95% or higher. The upper limit of the relative humidity of the atmosphere in the second step may be, for example, 100% or lower.

Method for Producing Nitride Fluorescent Material

The method for producing the nitride fluorescent material includes, for example, a providing step in which a raw material mixture that includes a lanthanum (La) source, a silicon (Si) source, and a cerium (Ce) source and in which at least one of these sources is a nitride is provided, and a nitride fluorescent material providing step in which heat treatment is applied to the provided raw material mixture to obtain the nitride fluorescent material.

In the providing step, the raw material mixture to obtain a desired nitride fluorescent material is provided. The raw material mixture includes at least the lanthanum (La) source, the silicon (Si) source, and the cerium (Ce) source, and may further include as necessary a rare earth element $M^1$ source that includes the rare earth element $M^1$ that is at least one selected from the group consisting of the rare earth elements except La and Ce. The rare earth element $M^1$ source including the rare earth element $M^1$ other than La and Ce may include at least one selected from the group consisting at least of yttrium (Y), gadolinium (Gd), and lutetium (Lu), may include at least one of at least Y and Gd, and may include at least Y. At least one selected from the group consisting of the lanthanum source, the silicon source, and the cerium source may also act as a nitrogen source or the rare earth element $M^1$ source may also act as a nitrogen source.

The lanthanum source may be a compound including La, a La simple substance, or an alloy including La, and may be at least one selected from the group consisting of the above. The compound including La may be at least one selected from the group consisting of an oxide, a halide (such as, for example, a fluoride or a chloride), a nitride, and an alloy, and may be preferably at least one selected from the group consisting of an oxide, a fluoride, and a nitride. The lanthanum source may be one of the above alone or may be a combination of two or more of the above. The purity of the lanthanum source may be, for example, 95% or higher and may be preferably 97% or higher, or 98% or higher. The upper limit of the purity of the lanthanum source may be, for example, 99.999% or lower.

The ratio of the number of moles of the element La included in the La source included in the raw material mixture may be, for example, 0 or greater and 4.5 or smaller, may be preferably 1.2 or greater, 1.5 or greater, or 2.0 or greater, and may be preferably 4.3 or smaller, or 4.0 or smaller, relative to 6 moles of silicon (Si) included in the raw material mixture.

The silicon source may be a compound including Si, a Si simple substance, or an alloy including Si, and may be at least one selected from the group consisting of the above. The compound including Si may be at least one selected from the group consisting of an oxide, a nitride, an alloy, or the like, may be preferably at least one selected from the group consisting of an oxide and a nitride, and may include more preferably at least a nitride. The compound including Si included in the Si source may be one of the above alone or may be a combination of two or more of the above. The purity of the silicon source may be, for example, 95% or higher and may be preferably 97% or higher, or 98% or higher. The upper limit of the purity of the silicon source may be, for example, 99.999% or lower.

The cerium source may be a compound including Ce, a Ce simple substance, an alloy including Ce or the like, and may be at least one selected from the group consisting of the above. The compound including Ce may be at least one selected from the group consisting of an oxide, a halide (such as, for example, a fluoride or a chloride), a nitride, and an alloy, may be preferably at least one selected from the group consisting of an oxide, a fluoride, and a nitride, and may include more preferably at least a fluoride. The compound including Ce included in the Ce source may be one of the above alone or may be a combination of two or more of the above. The purity of the cerium source may be, for example, 95% or higher and may be preferably 97% or higher, or 98% or higher. The upper limit of the purity of the cerium source may be, for example, 99.999% or lower.

The ratio of the number of moles of the element Ce included in the Ce source included in the raw material mixture may be, for example, greater than 0 and 1.5 or smaller, may be preferably 0.05 or greater, or 0.1 or greater, and may be preferably 1.3 or smaller, or 1.2 or smaller, relative to 6 moles of silicon (Si) included in the raw material mixture.

The rare earth element $M^1$ source may include at least one selected from the group consisting of Y, Lu, and Gd, and may include at least Y. The mole content of Y, relative to the total mole amount of the rate earth element $M^1$ included in the rare earth element $M^1$ source may be, for example, 90% or higher and may be preferably 95% or higher, or 98% or higher. The rare earth element $M^1$ source may be a compound including the rare earth element $M^1$, a simple substance of the rare earth element $M^1$, or an alloy including the rare earth element $M^1$, and may be at least one selected from the group consisting of the above. The compound including the rare earth element $M^1$ may be at least one selected from the group consisting of an oxide, a halide (such as, for example, a fluoride or a chloride), a nitride, an alloy, and the like, and may be preferably at least one selected from the group consisting of an oxide, a fluoride, and a nitride. The compound including the rare earth element $M^1$ included in the rare earth element $M^1$ source may be one of the above alone or may be a combination of two or more of the above. The purity of the rare earth element $M^1$ source may be, for example, 95% or higher and may be preferably 97% or higher, or 98% or higher. The upper limit of the purity of the rare earth element $M^1$ source may be, for example, 99.999% or lower.

The ratio of the number of moles of the rare earth element $M^1$ included in the rare earth element $M^1$ source included in the raw material mixture may be, for example, greater than 0 and 1.5 or smaller, may be preferably 0.2 or greater, or 0.3 or greater, and may be preferably 1.4 or smaller, or 1.2 or smaller in the case where silicon (Si) included in the raw material mixture is 6 moles.

The ratio of the total number of moles of the rare earth element $M^1$ and the element Ce included in the raw material mixture may be, for example, greater than 0.15 and smaller than 3, may be preferably greater than 0.2, or greater than 0.3, and may be preferably smaller than 2.6, or smaller than 2.4 relative to 6 moles of silicon (Si) included in the raw material mixture. The ratio of the total number of moles of the element La, the rare earth element $M^1$, and the element Ce sources included in the mixture may be, for example, 3 or greater and 7.5 or smaller, may be preferably 3.1 or greater or 3.2 or greater, and may be preferably be 6.8 or smaller, 6.3 or smaller, or 5.8 or smaller relative to 6 moles of silicon (Si) included in the mixture.

The raw material mixture may include a halide such as a fluoride or the like as at least a portion of at least one element source selected from the group consisting of the lanthanum source, the silicon source, the cerium source, and the rare earth element $M^1$ source. The halide may be a substance that functions as a flux. In the case where the raw material mixture includes the halide, the content of the halide relative to the total mass of the raw material mixture may be, for example, 1% by mass or more and 40% by mass or less, may be preferably 2.5% by mass or more, or 5% by mass or more, and may be preferably 35% by mass or less, or 30% by mass or less.

After weighing the lanthanum source, the silicon source, the cerium source, and the rare earth element $M^1$ source that is included as necessary to establish the desired blending ratios, the raw material mixture may be obtained by mixing the sources with each other using a mixing method that uses a ball mill or the like, a mixing method that uses a mixing machine such as a Henschel mixer, or a V-type blender, a mixing method that uses a mortar and a pestle, or the like. The mixing may be executed as dry mixing or may be executed as wet mixing with a solvent or the like added thereto.

The nitride fluorescent material providing step includes application of heat treatment to the prepared raw material mixture to obtain the nitride fluorescent material. The heat treatment temperature for the raw material mixture may be, for example, 1,400° C. or higher and 2,000° C. or lower. The heat treatment temperature for the raw material mixture may be preferably 1,500° C. or higher, or 1,600° C. or higher, and may be preferably 1,900° C. or lower, or 1,850° C. or lower.

The heat treatment at the nitride fluorescent material providing step may include increasing the temperature to a predetermined heat treatment temperature, maintaining the predetermined heat treatment temperature, and decreasing the temperature from the heat treatment temperature. The temperature increase rate to the predetermined heat treatment temperature as the temperature increase rate from, for example, the room temperature may be 0.02° C./min or higher and 5° C./min or lower, may be preferably 0.08° C./min or higher, or 0.15° C./min or higher, and may be preferably 3.3° C./min or lower, or 1.7° C./min or lower.

The heat treatment time period during which the predetermined heat treatment temperature is maintained may be, for example, 1 hour or more and 30 hours or less, may be preferably 2 hours or more, or 4 hours or more, and may be preferably 20 hours or less, or 10 hours or less. The temperature decrease rate from the predetermined heat treatment temperature may be, for example, 1° C./min or higher and 600° C./min or lower as the temperature decrease rate to, for example, the room temperature.

The atmosphere in the heat treatment for the raw material mixture may be an inert gas that includes a noble gas such as nitrogen or argon, or may be a reducing atmosphere including a reducing gas such as hydrogen.

The pressure in the heat treatment for the raw material mixture can be set to be a pressure ranging, for example, from the atmospheric pressure to 200 MPa. From the viewpoint of suppressing decomposition of the nitride fluorescent material to be produced, it is preferred that the pressure be high, and the pressure, as the gauge pressure, is preferably 0.1 MPa or higher and 200 MPa or lower, is more preferably 0.5 MPa or higher and 20 MPa or lower, and is more preferably 0.6 MPa or higher and 1.2 MPa or lower with which restrictions by the industrial equipment are few.

The heat treatment for the raw material mixture may be executed using, for example, a gas pressurized electric furnace. The heat treatment for the raw material mixture may be executed by, for example, filling a crucible, a boat, or the like made from a carbon material such as graphite or a boron nitride (BN) material with the raw material mixture to be used. In addition to the carbon material and the boron nitride material, an alumina ($Al_2O_3$) material, an Mo material, a W material, and the like are also usable.

After the heat treatment for the raw material mixture, such a step may be included as a granulating step of executing processes such as shredding, crushing, washing, and a classification operation in combination for the heat treated substance obtained in the heat treatment. Powder having the desired particle diameter may be obtained in the granulating step. For example, the heat treated substance is roughly crushed and thereafter the heat treated substance may be crushed into particles having the desired particle diameter using a common crushing machine such as a ball mill, a jet mill, or a vibration mill. The washing may be executed by, for example, dispersing the heat treated substance in water and executing solid-liquid separation. The solid-liquid separation may be executed by a method that is ordinarily used industrially such as filtration, suction filtration, pressure filtration, centrifugal separation, or decantation. Acid treatment may also be executed for the heat treated substance. The acid treatment may be executed by, for example, dispersing the heat treated substance in an acidic water solution and executing solid-liquid separation. After the acid treatment, washing with water and solid-liquid separation may also be executed. After the solid-liquid separation, a drying process may also be executed. The drying process may be executed by an apparatus that is ordinarily used industrially such as a vacuum dryer, a hot air dryer, a conical dryer, or a rotary evaporator.

Wavelength Converting Member

A wavelength converting member includes a support, and a fluorescent material layer that is disposed on the support and that includes a fluorescent material. The fluorescent material included in the fluorescent material layer may include a nitride fluorescent material that includes La, Ce, Si, and N, and the first phosphorus compound present on the surface of the nitride fluorescent material. The wavelength converting member may constitute a light emitting device by being combined with a light emitting element. The fluorescent material may present a light emission property that is excellent in the linearity with which the light emission intensity of the output light is increased in proportion to the output power of the light emitting element, and is therefore excellent in the light emission property, by including the nitride fluorescent material having the first phosphorus compound formed on the surface thereof.

Figure 1B:
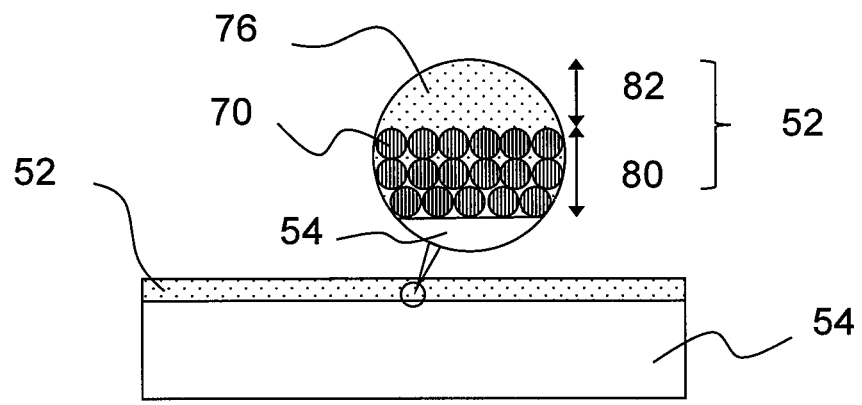
FIG. 1B is an exemplary side diagram of the exemplary wavelength converting member seen from the side face thereof and is an enlarged cross-sectional diagram of a portion thereof.

FIG. 1A and FIG. 1B schematically show an example of the wavelength converting member. FIG. 1A is a schematic plan diagram of a wavelength converting member 50 seen from the side of the principal surface thereof. FIG. 1B is a schematic side diagram of the wavelength converting member 50 seen from the side of the side face thereof and an enlarged cross-sectional diagram of a portion thereof. As shown in FIG. 1A, a wavelength converting layer 52 is disposed along the circumference of a disc-like support 54. As shown in FIG. 1B, on one of the principal surfaces of the support 54, a fluorescent material layer 80 that includes a fluorescent material 70, and a light transmitting layer 82 that includes a resin 76 are stacked in this order and a wavelength converting layer 52 is thereby disposed.

Light Emitting Device

A light emitting device may include a light emitting element that has a light emission peak wavelength in a wavelength range of 350 nm or more and 500 nm or less, and a fluorescent material that is excited by the light emitting element. The fluorescent material included in the light emitting device may include the nitride fluorescent material that includes La, Ce, and Si, and the first phosphorus compound that is present on the surface of the nitride fluorescent material. The fluorescent material may be included in the fluorescent material layer that constitutes the wavelength converting member.

The peak emission wavelength of the light emitting element may be in a wavelength range of, for example, 350 nm or more and 500 nm or less, and may be in a wavelength range of preferably 380 nm or more and 470 nm or less, or a wavelength range of 400 nm or more and 460 nm or less. A light emitting device emitting mixed color light of the light from the light emitting element and the fluorescence from the fluorescent material may be constituted by using this light emitting element having the light emission peak wavelength in these ranges as an excitation light source. A portion of the light radiated from the light emitting element may be effectively utilized as a portion of the light radiated from the light emitting device to the exterior, and the light emitting device having high light emission efficiency may therefore be achieved.

The half maximum full width of the light emission spectrum of the light emitting device may be, for example, 30 nm or shorter. It is preferred that, for example, a semiconductor light emitting element that uses a nitride-based semiconductor be used as the light emitting element. A light emitting device that has high efficiency and high linearity of the output power thereof to an input and that is robust against mechanical impacts and stable may be achieved by using the semiconductor light emitting element as the excitation light source. The light emitting element may be a light emitting diode (LED) or may be a laser diode (LD), and the light emitting element may use the one of these alone or may use two or more thereof in combination.

The output power of the light emitting element may be, for example, 0.5 W/mm$^2$ or larger and is preferably 5 W/mm$^2$ or larger, or 10 W/mm$^2$ or higher, as the light power density injected into the wavelength converting member. The upper limit of the output power of the light emitting element may be, for example, 1,000 W/mm$^2$ or smaller and is preferably 500 W/mm$^2$ or smaller, or 150 W/mm$^2$ or smaller. When the output power of the light emitting element is in the above ranges, the wavelength converting member is more excellent in the linearity responding to the output power of the light emitting element.

Figure 2:
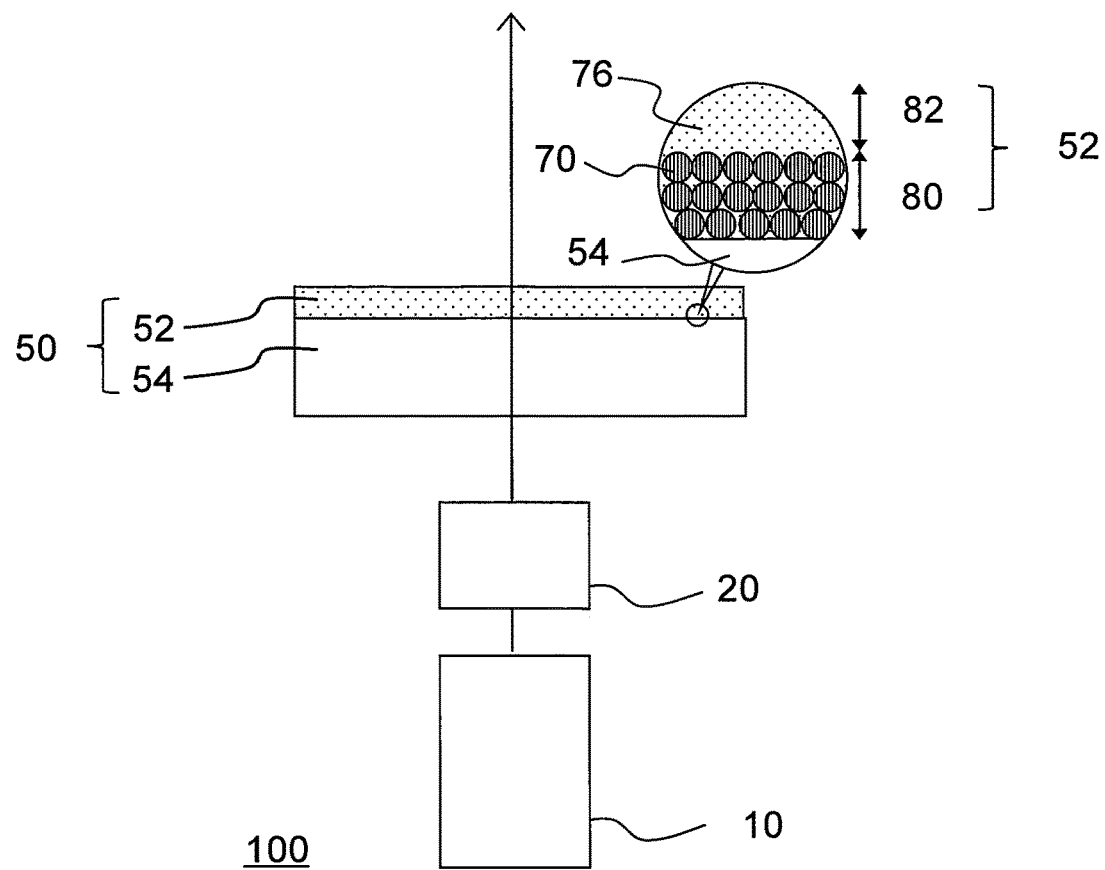
FIG. 2 is an exemplary schematic configuration diagram showing an exemplary light emitting device, and an exemplary enlarged diagram showing a portion of a wavelength converting member thereof.

A configuration example of the light emitting device will be described with reference to the drawings. FIG. 2 is a schematic configuration diagram showing an example of the configuration of a light emitting device. The light emitting device 100 includes a light emitting element 10, an incident optical system 20, and a wavelength converting member 50. The wavelength converting member 50 includes the supporting body 54, and the wavelength converting layer 52 disposed on the support 54. The wavelength converting layer 52 includes the fluorescent material layer 80 including the fluorescent material 70, and the light transmitting layer 82 including the resin 76. The light exiting from the light emitting element 10 passes through the incident optical system 20, enters into the wavelength converting member 50 from the side of the support 54, and passes through the fluorescent material layer 80 that includes the fluorescent material 70, and at least a portion of the incident light is wavelength-converted by the fluorescent material 70. Otherwise, the wavelength-converted light and the remaining portion not wavelength-converted of the incident light both exit from the wavelength converting member 50. In this case, the light exiting from the light emitting device 100 is a color-mixed light of the light from the light emitting element 10 and the wavelength-converted light.

Figure 3:
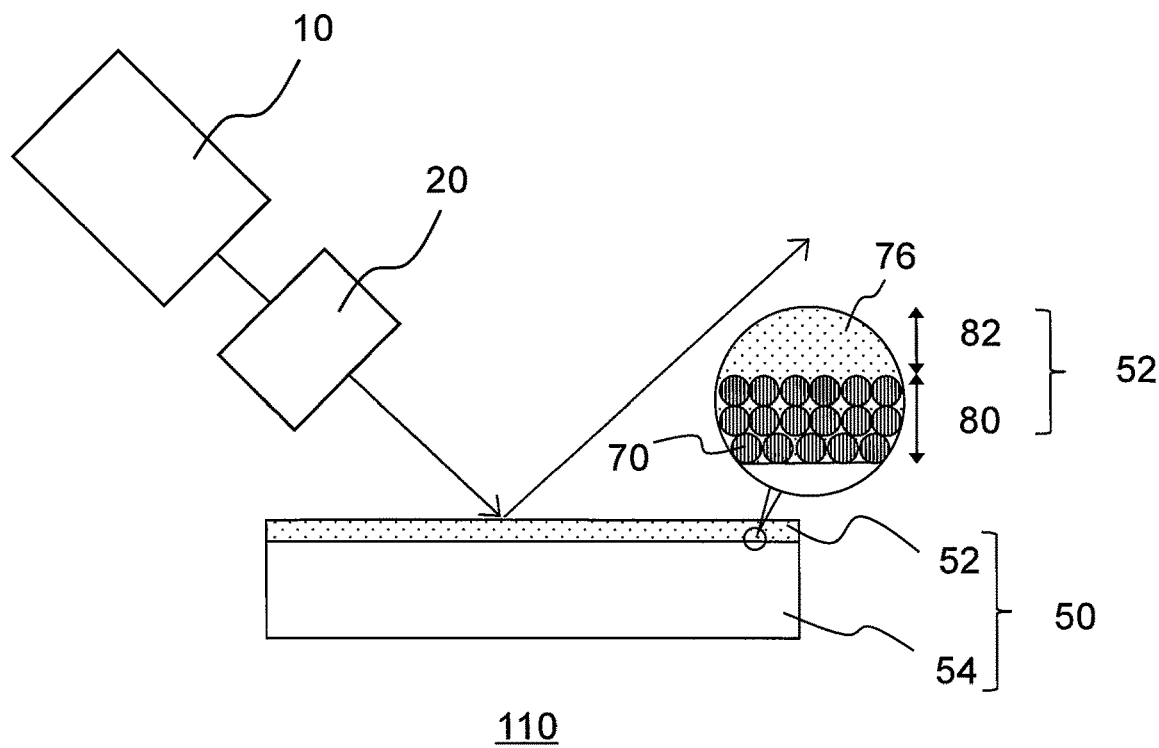
FIG. 3 is an exemplary schematic configuration diagram showing another exemplary light emitting device, and an exemplary enlarged diagram showing a portion of a wavelength converting member thereof.

FIG. 3 is a schematic configuration diagram showing an example of the configuration of a light emitting device. The light emitting device 110 includes the light emitting element 10, the incident optical system 20, and the wavelength converting member 50. The wavelength converting member 50 includes the support 54, and the wavelength converting layer 52 disposed on the support 54. The wavelength converting layer 52 has the fluorescent material layer 80 including the fluorescent material 70, and the light transmitting layer 82 including the resin 76 stacked therein in this order. The light exiting from the light emitting element 10 passes through the incident optical system 20, enters into the wavelength converting member 50 from the side of the wavelength converting layer 52, and passes through the wavelength converting layer 52, and the reflected light exits from the wavelength converting layer 52. At least a portion of the light passing through the wavelength converting layer 52 is wavelength-converted by the fluorescent material 70. Otherwise, the wavelength-converted light and the remaining portion not wavelength-converted of the incident light both exit from the wavelength converting member 50. In this case, the light exiting from the light emitting device 110 is a color-mixed light of the light from the light emitting element 10 and the wavelength-converted light.

Light Source Device for Projector

A light source device for a projector includes the light emitting device to be configured. A projector with high output power can be configured by including the light emitting device that is excellent in the light emission property at high output power.

The light emitting device including the wavelength converting member of the present disclosure is usable not only as a light source device for a projector but also as, for example, a light emitting device included in a general lighting device such as a ceiling light, a special lighting device such as a spot light, stadium lighting, or studio lighting, a lighting device for a vehicle such as a head light, a projection device such as a head up display, a light for an endoscope, a shooting device such as a digital camera, a mobile phone, or a smartphone, or a light source in a liquid crystal display or the like of a monitor for a personal computer (PC), a notebook personal computer, a television, a portable information terminal (PDX), a smartphone, a tablet PC, or a mobile phone.

EXAMPLES

The present invention will be described below in detail with reference to Examples while the present invention is not limited to Examples.

Example 1

Lanthanum nitride (LaN) as the La source, yttrium nitride (YN) as the Y source, silicon nitride ($Si_3N_4$) as the Si source, and cerium nitride (CeN) as the Ce source were used. The raw materials were weighed to establish the mole ratios of the elements to be La:Y:Si:Ce=2.0:0.5:6:0.5. For example, 42.78 g of LaN, 7.20 g of YN, 39.25 g of $Si_3N_4$, and 10.78 g of CeN were weighed.

The weighed raw materials were fully crushed and mixed with each other in a dry manner to obtain a raw material mixture. The obtained raw material mixture was packed in a crucible to execute heat treatment at 1,800° C. for 5 hours in a reducing atmosphere. In this treatment, the temperature increase rate for a range from the room temperature to 1,800° C. was set to be 5° C./min to obtain a heat treated substance. The obtained heat treated substance was crushed and dispersed in water, and was thereafter collected by solid-liquid separation to collect a fluorescent material. The collected fluorescent material was treated by a 7%-hydrochloric acid solvent to thereafter execute washing with water and the like until pH presented neutrality of about 7.0. The composition of a powder-like nitride fluorescent material obtained by thereafter being dried was $La_{1.92}Y_{0.46}Ce_{0.45}Si_6N_{10.64}O_{0.05}H_{0.04}$.

To the obtained nitride fluorescent material (20 g), diammonium hydrogen phosphate $(HN_4)_2HPO_4$ was added in an amount of 0.02 g that was 0.1% by mass relative to the nitride fluorescent material, to apply thereto heat treatment by storing the nitride fluorescent material in an unsaturated accelerated pressure cooker testing apparatus (PCT apparatus) for 24 hours under the conditions of the relative humidity of 100% and the temperature of 130°, and washing with water was thereafter executed for the nitride fluorescent material to be dried in a drier at 85° C. for 1 night to thereby obtain a powder-like fluorescent material of Example 1.

Example 2

A fluorescent material of Example 2 was obtained in the same manner as that of Example 1 except the fact that 0.2 g (1% by mass) of diammonium hydrogen phosphate $(HN_4)_2HPO_4$ was added to the obtained nitride fluorescent material (20 g).

Example 3

A fluorescent material of Example 3 was obtained in the same manner as that of Example 1 except the fact that 2.0 g (10% by mass) of diammonium hydrogen phosphate $(HN_4)_2HPO_4$ was added to the obtained nitride fluorescent material (20 g).

Example 4

A fluorescent material of Example 4 was obtained in the same manner as that of Example 1 except the fact that 5.0 g (25% by mass) of diammonium hydrogen phosphate $(HN_4)_2HPO_4$ was added to the obtained nitride fluorescent material (20 g).

Example 5

A fluorescent material of Example 5 was obtained in the same manner as that of Example 1 except the fact that 9.0 g (45% by mass) of diammonium hydrogen phosphate $(HN_4)_2HPO_4$ was added to the obtained nitride fluorescent material (20 g).

Comparative Example 1

The nitride fluorescent material obtained in Example 1 was taken as a fluorescent material of Comparative Example 1. For the fluorescent material of Comparative Example 1, the heat treatment in the presence of diammonium hydrogen phosphate and water was not executed.

Comparative Example 2

A powder-like fluorescent material of Comparative Example 2 was obtained by storing the obtained nitride fluorescent material, in an unsaturated accelerated pressure cooker testing apparatus (PCT apparatus) for 24 hours under the conditions of the relative humidity of 100% and the temperature of 130° C. without adding thereto diammonium hydrogen phosphate.

Comparative Example 3

A fluorescent material of Comparative Example 3 was obtained in the same manner as that of Example 1 except the fact that 10.0 g (50% by mass) of diammonium hydrogen phosphate $(HN_4)_2HPO_4$ was added to the obtained nitride fluorescent material (20 g).

Comparative Example 4

A fluorescent material of Comparative Example 4 was obtained in the same manner as that of Example 1 except the fact that 2.0 g (10% by mass) of diammonium hydrogen phosphate $(HN_4)_2HPO_4$ was added to the obtained nitride fluorescent material (20 g) and that the conditions for the heat treatment by the unsaturated accelerated pressure cooker testing apparatus (PCT apparatus) were set to be conditions of no humidifying and the temperature of 130° C.

Evaluation

1. Contents of Phosphorus Atoms, Oxygen Atoms, and Hydrogen Atoms

For each of the fluorescent materials obtained as above, the contents (% by mass) of phosphorus atoms, oxygen atoms, and hydrogen atoms were determined by the inductively coupled plasma (ICP) atomic emission spectroscopy and an oxygen, nitrogen, and hydrogen elemental analyzer (HORIBA Ltd., EMGA-930). Table 1 shows the result thereof.

2. Median Particle Diameter

For each of the fluorescent materials obtained as above, the volume-based particle size distribution was measured using a laser diffraction particle size distribution measuring apparatus (product name: MASTER SIZER 3000, manufactured by Malvern Panalytical) to determine the median particle diameter (Dm; μm) as the particle diameter corresponding to the accumulated 50% from the small diameter side. Table 1 shows the results thereof.

3. Chromaticity Coordinates and Relative Emission Intensity

Figure 4:
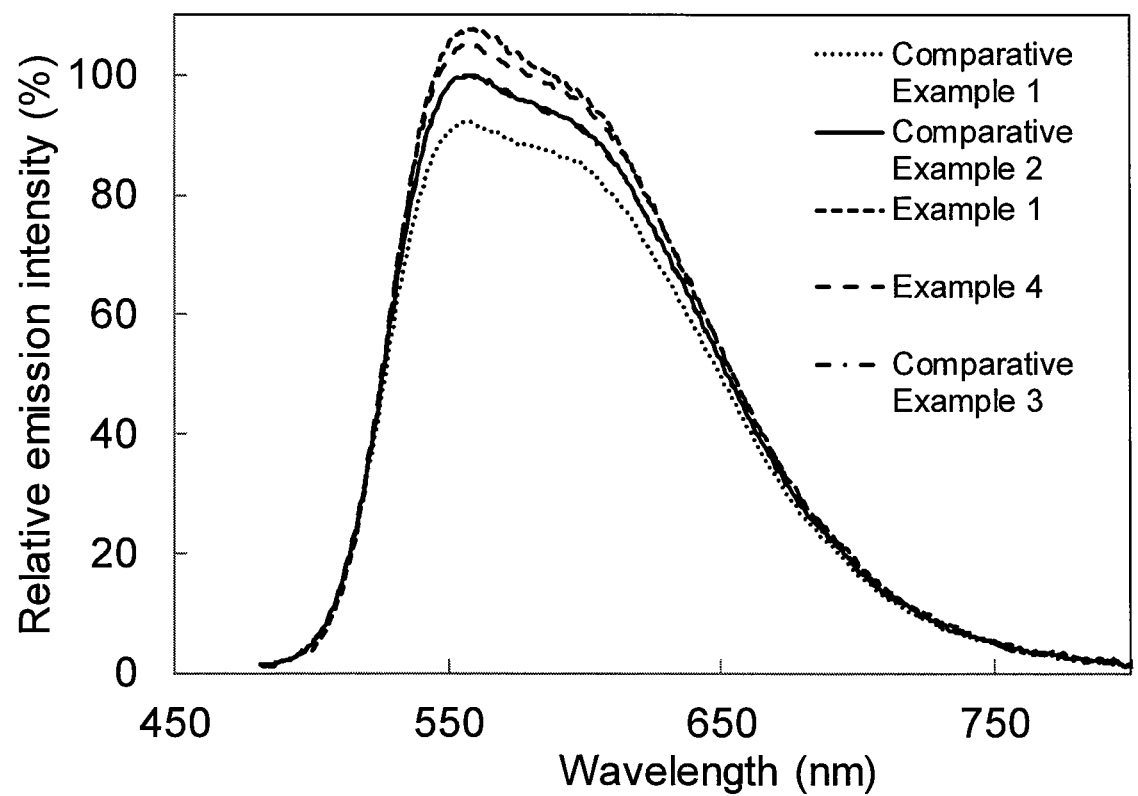
FIG. 4 shows an exemplary light emission spectra of fluorescent materials.

For each of the fluorescent materials obtained as above, the chromaticity coordinates and the light emission intensity were measured using a quantum efficiency measurement system (manufactured by Otsuka Electronics Co., Ltd., QE-2000). Table 1 shows the result thereof. The light emission intensity is shown as a relative emission intensity (ENG %) using the fluorescent material of Comparative Example 2 as the criterion. FIG. 4 depicts the light emission spectra of the fluorescent materials of Examples 1 and 4, and Comparative Examples 1, 2, and 3. FIG. 4 depicts the light emission spectra that are normalized using the maximal emission intensity of the fluorescent material of Comparative Example 2.

4. Composition of Fluorescent Material

For each of the fluorescent materials obtained as above, the composition ratios of the constituent elements in the case where that of silicon (Si) was set to be 6 were determined using the inductively coupled plasma (ICP) atomic emission spectroscopy and an oxygen, nitrogen, and hydrogen elemental analyzer (HORIBA Ltd., EMGA-930). Table 2 shows the result thereof.

TABLE 1

|  | Second phosphorus compound (mass %) | Mean particle diameter (μm) | Chromaticity coordinates x | Chromaticity coordinates y | Relative emission intensity (%) | Contnet rate (mass %) P | Contnet rate (mass %) O | Contnet rate (mass %) H |
|---|---|---|---|---|---|---|---|---|
| Comparative Example 1 | — | 20.0 | 0.484 | 0.508 | 93.4 | 0.00 | 0.12 | 0.01 |
| Comparative Example 2 | — | 20.9 | 0.484 | 0.508 | 100.0 | 0.00 | 0.53 | 0.02 |
| Example 1 | 0.1 | 20.8 | 0.486 | 0.507 | 104.7 | 0.08 | 0.82 | 0.03 |
| Example 2 | 1.0 | 22.2 | 0.486 | 0.507 | 102.3 | 0.08 | 0.80 | 0.02 |
| Example 3 | 10.0 | 23.1 | 0.487 | 0.506 | 103.7 | 0.21 | 1.26 | 0.03 |
| Example 4 | 25.0 | 22.1 | 0.484 | 0.508 | 104.0 | 0.64 | 3.18 | 0.09 |
| Example 5 | 45.0 | 21.4 | 0.485 | 0.507 | 103.2 | 0.61 | 3.21 | 0.09 |
| Comparative Example 3 | 50.0 | 21.9 | 0.483 | 0.509 | 99.6 | 0.83 | 4.04 | 0.11 |
| Comparative Example 4 | 10.0 | 20.5 | 0.486 | 0.507 | 92.9 | 0.00 | 0.14 | 0.01 |

TABLE 2

|  | Composition ratio (Si = 6) | | | | | | |
|---|---|---|---|---|---|---|---|
|  | La | Ce | Y | P | O | N | H |
| Comparative Example 1 | 1.92 | 0.45 | 0.46 | 0.00 | 0.05 | 10.64 | 0.04 |
| Comparative Example 2 | 1.94 | 0.45 | 0.47 | 0.00 | 0.23 | 10.83 | 0.14 |
| Example 1 | 1.95 | 0.46 | 0.47 | 0.02 | 0.36 | 10.70 | 0.23 |
| Example 2 | 1.93 | 0.46 | 0.47 | 0.02 | 0.35 | 10.74 | 0.17 |
| Example 3 | 1.91 | 0.45 | 0.46 | 0.05 | 0.54 | 10.54 | 0.23 |
| Example 4 | 1.91 | 0.44 | 0.46 | 0.15 | 1.41 | 10.24 | 0.61 |
| Example 5 | 1.88 | 0.44 | 0.46 | 0.14 | 1.40 | 10.04 | 0.61 |
| Comparative Example 3 | 1.90 | 0.45 | 0.46 | 0.19 | 1.80 | 10.02 | 0.78 |
| Comparative Example 4 | 1.94 | 0.45 | 0.47 | 0.00 | 0.06 | 10.74 | 0.07 |

From Table 1, improvement of the light emission intensity was achieved by storing the fluorescent materials under conditions of a high temperature and a high humidity. It may be seen that a higher light emission intensity may be achieved by executing the similar treatment with addition of more phosphate. It may be considered that this is because the effect worked by the fact that the circumference of the nitride fluorescent material having a high refractive index is covered by an oxide having a low refractive index. It may be considered that, in the case where the addition amount of the phosphate was appropriate, the excessive portion thereof was not involved in the reaction and was removed at the washing step.

Fabrication of Wavelength Converting Member (Phosphor Wheel: PW)

100 mass parts of a silicone resin that was a binding agent and 167 mass parts of the fluorescent material of Example 1 were mixed with each other to prepare a fluorescent material paste. Such a metal member was used as the support as the one whose material was aluminum and that had a plate-like shape and that had a disc-like shape in a plan view taken from the side of its principal surface. On one of the principal surfaces of the support, the fluorescent material paste was annularly disposed in a predetermined width and along the circumference of the metal member to form a wavelength converting layer. The desired wavelength converting member was thereby obtained.

The measurement was executed with the thickness of the wavelength converting layer set as below. A measurement point was set at every 45° on the circumference of the wavelength converting face applied to the disc-like supporting body, and the measurement was executed using Digi-Matching Indicator (Mitutoyo Corporation) at orthogonal points. The arithmetic mean value of the thicknesses at the measurement points was calculated and the value acquired by subtracting the thickness of the supporting body from the arithmetic mean value was taken as the thickness of the wavelength converting layer.

A wavelength converting member was obtained for Examples 2 to 5 and Comparative Examples 1 to 4 in the same manner as described above except the fact that each of the fluorescent materials of Examples 2 to 5 and Comparative Examples 1 to 4 were used instead of the fluorescent material of Example 1.

Evaluation of Wavelength Converting Member

Figure 5:
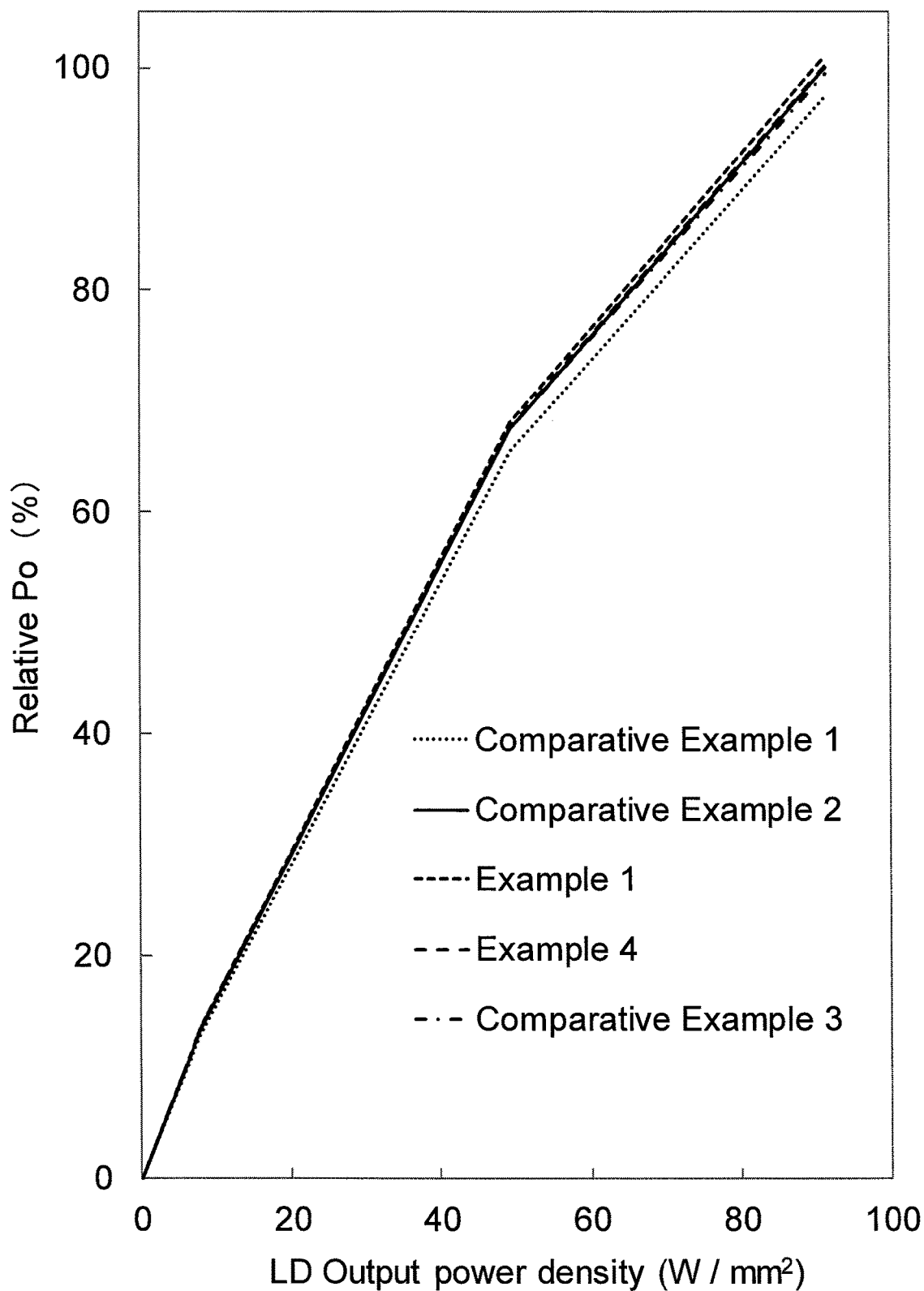
FIG. 5 shows an exemplary relative light emission intensity variation of emitted light from the wavelength converting member against variation of the output power density of a laser diode.

For the wavelength converting member fabricated as above, the light emission intensity was measured as below. The disc-like wavelength converting member was fixed to a driving apparatus and the light emission property was measured rotating the wavelength converting member at 7,200 rpm. A laser diode (LD) having the light emission peak wavelength of 455 nm was prepared as the excitation light source for the wavelength converting member, and the output power density (W/mm$^2$) of the laser diode was varied stepwise, and the light emission intensity of the exiting light from the wavelength converting member at each of the output power densities was measured in the range of 470 nm or more and 800 nm or less. For the light emission intensity, the relative Po (%) was taken that was acquired when the light emission intensity at each of the output power densities of the laser diode in Comparative Example 2 was taken as the criterion (100.0%). FIG. 5 shows the variation of the light emission intensity (the relative Po (%)) of the emitted light of the wavelength converting member against the variation of the output power density of the laser diode for the wavelength converting members of Examples 1 and 4, and Comparative Examples 1, 2, and 3. Table 3 shows the relative Po (%) at an output power density of 91.5 W/mm$^2$ of the laser diode (LD) for the wavelength converting members of Examples and Comparative Examples.

TABLE 3

| | Thickness of wavelength converting layer (μm) | Relative emission intensity (%) |
|---|---|---|
| Comparative Example 1 | 68.8 | 97.5 |
| Comparative Example 2 | 68.8 | 100.0 |
| Example 1 | 72.3 | 101.1 |
| Example 2 | 68.9 | 104.1 |
| Example 3 | 71.2 | 104.3 |
| Example 4 | 73.2 | 100.2 |
| Example 5 | 68.8 | 101.9 |
| Comparative Example 3 | 70.6 | 99.5 |
| Comparative Example 4 | 68.7 | 95.5 |

From Table 3, it may be seen that those that were each added with phosphate and whose light emission intensities were improved, each had a higher light emission intensity as to the light emission property measured using the LD as the excitation light source.

The fluorescent material of the present disclosure is usable as a fluorescent material included in a wavelength converting member included in a light source in, for example, a general lighting device such as a ceiling light, a lighting device for a vehicle such as a spot light or a head light, a projection device such as a projector or a head up display, a shooting device such as a digital camera, a mobile phone, or a smartphone, or a liquid crystal display device such as a monitor for a personal computer (PC), a television, a portable information terminal (PDX), a smartphone, a tablet PC, or a mobile phone.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A fluorescent material comprising:
   a nitride fluorescent material comprising La, Ce, Si, and N; and
   a first phosphorus compound disposed on a surface of the nitride fluorescent material, wherein
   the first phosphorus compound comprises at least one selected from the group consisting of lanthanum phosphate, lanthanum hydrogen phosphate, and hydrates thereof, and wherein
   a content of phosphorus atoms in the fluorescent material is 0.07% by mass or higher and 0.8% by mass or lower.

2. The fluorescent material according to claim 1, further comprising oxygen atoms and hydrogen atoms, wherein
   a content of the oxygen atoms in the fluorescent material is 0.6% by mass or higher, and wherein
   a content of the hydrogen atoms in the fluorescent material is 0.02% by mass or higher.

3. The fluorescent material according to claim 1, wherein the nitride fluorescent material has a composition represented by Formula (1) below:

$$La_p Ce_s M^1_q M^2_r N_t \qquad (1),$$

wherein
   in Formula (1), $M^1$ represents at least one selected from the group consisting of rare earth elements except La and Ce, and comprises at least one of Y, Gd, or Lu, wherein
   $M^2$ represents at least one selected from the group consisting of Si, Ge, B, Al, and Ga, and comprises at least Si, and wherein
   p, q, r, s, and t satisfy $2.7 \leq p+q+s \leq 3.3$, $0 \leq q \leq 1.2$, $5.4 \leq r \leq 6.6$, $10 \leq t \leq 12$, and $0 < s \leq 1.2$.

4. The fluorescent material according to claim 3, wherein in Formula (1), $M^1$ comprises at least one of Y or Gd.

5. A light emitting device comprising:
a light emitting element having a light emission peak wavelength in a wavelength range of 350 nm or more and 500 nm or less; and
a wavelength converting member comprising the fluorescent material according to claim 1, which is excited by the light emitting element.

6. A method for producing a fluorescent material comprising
applying heat treatment to a nitride fluorescent material having a composition represented by Formula (1) at a temperature of 90° C. or higher and 400° C. or lower in presence of a second phosphorus compound at 0.1% by mass or higher and 47% by mass or lower relative to the nitride fluorescent material, and liquid or gaseous water, $$La_p Ce_s M^1_q M^2_r N_t \qquad (1),$$

wherein
in Formula (1), $M^1$ represents at least one selected from the group consisting of rare earth elements except La and Ce, and comprises at least one of Y, Gd, or Lu, wherein
$M^2$ represents at least one selected from the group consisting of Si, Ge, B, Al, and Ga, and comprises at least Si, and wherein
p, q, r, s, and t satisfy $2.7 \leq p+q+s \leq 3.3$, $0 \leq q \leq 1.2$, $5.4 \leq r \leq 6.6$, $10 \leq t \leq 12$, and $0 < s \leq 1.2$.

7. The method according to claim 6, wherein
the heat treatment is executed under a relative humidity of 85% or higher.

8. The method according to claim 6, wherein
the heat treatment causes the second phosphorus compound and the liquid or gaseous water to form at least one selected from the group consisting of lanthanum phosphate, lanthanum hydrogen phosphate, and hydrates thereof on a surface of the nitride fluorescent material.

9. The method according to claim 6, wherein
the second phosphorus compound comprises at least one of phosphoric acid, phosphorus oxide, a phosphate ammonium salt, an alkali metal phosphate, or an alkali earth metal phosphate.

* * * * *